United States Patent
Honma et al.

(10) Patent No.: US 11,869,798 B2
(45) Date of Patent: Jan. 9, 2024

(54) DEPOSITION APPARATUS

(71) Applicant: Tokyo Electron Limited, Tokyo (JP)

(72) Inventors: Manabu Honma, Iwate (JP); Yudo Sugawara, Iwate (JP); Noriko Sato, Iwate (JP)

(73) Assignee: Tokyo Electron Limited, Tokyo (JP)

(*) Notice: Subject to any disclaimer, the term of this patent is extended or adjusted under 35 U.S.C. 154(b) by 317 days.

(21) Appl. No.: 17/154,065

(22) Filed: Jan. 21, 2021

(65) Prior Publication Data

US 2021/0242070 A1    Aug. 5, 2021

(30) Foreign Application Priority Data

Feb. 3, 2020  (JP) .................. 2020-016153

(51) Int. Cl.
| | | |
|---|---|---|
| *C23C 16/46* | (2006.01) | |
| *H01L 21/687* | (2006.01) | |
| *C23C 14/50* | (2006.01) | |
| *C23C 14/24* | (2006.01) | |
| *H01L 21/67* | (2006.01) | |
| *C23C 16/455* | (2006.01) | |
| *C23C 16/458* | (2006.01) | |

(52) U.S. Cl.
CPC ........ *H01L 21/68785* (2013.01); *C23C 14/24* (2013.01); *C23C 14/505* (2013.01); *C23C 16/4584* (2013.01); *C23C 16/45551* (2013.01); *C23C 16/46* (2013.01); *H01L 21/67109* (2013.01); *H01L 21/67115* (2013.01); *H01L 21/68771* (2013.01)

(58) Field of Classification Search
CPC ......... H01L 21/68785; H01L 21/67115; H01L 21/68771; C23C 16/45551; C23C 16/4584; C23C 16/4586; C23C 16/46
See application file for complete search history.

(56) References Cited

U.S. PATENT DOCUMENTS

| | | | |
|---|---|---|---|
| 5,571,010 A * | 11/1996 | Okase ................. | C23C 16/4583 432/239 |
| 5,651,826 A * | 7/1997 | Takagi .............. | H01J 37/32522 118/724 |
| 6,197,118 B1 * | 3/2001 | Sakai .................. | H01L 21/0217 257/E21.279 |

(Continued)

FOREIGN PATENT DOCUMENTS

| | | |
|---|---|---|
| JP | 2010-010210 | 1/2010 |
| JP | 2010-056561 | 3/2010 |

(Continued)

*Primary Examiner* — Aiden Lee
(74) *Attorney, Agent, or Firm* — IPUSA, PLLC

(57) ABSTRACT

A deposition apparatus according to one aspect of the present disclosure includes a vacuum vessel, a rotary table rotatably disposed in the vacuum vessel, a heating device provided below the rotary table, and a radiation adjusting member. The rotary table is configured such that multiple substrates can be placed on the rotary table along a circumferential direction of the rotary table. The heating device is configured to heat the multiple substrates by thermal radiation, and the radiation adjusting member is configured to adjust an amount of radiant heat from the heating device to the plurality of substrates.

13 Claims, 15 Drawing Sheets

(56) References Cited

U.S. PATENT DOCUMENTS

| | | | | |
|---|---|---|---|---|
| 6,598,559 | B1* | 7/2003 | Vellore | H01L 21/67115 |
| | | | | 118/723 VE |
| 2006/0191483 | A1* | 8/2006 | Blomiley | C23C 16/4586 |
| | | | | 118/725 |
| 2014/0011369 | A1* | 1/2014 | Kato | C23C 16/46 |
| | | | | 438/771 |
| 2017/0253969 | A1* | 9/2017 | Inaba | C23C 16/4482 |
| 2017/0321346 | A1* | 11/2017 | Harashima | C23C 16/46 |
| 2019/0161885 | A1* | 5/2019 | Motoyama | C23C 16/4586 |
| 2019/0376179 | A1* | 12/2019 | Suda | C23C 16/4586 |

FOREIGN PATENT DOCUMENTS

| | | |
|---|---|---|
| JP | 2010-059494 | 3/2010 |
| JP | 2013-145859 | 7/2013 |
| JP | 2014-185363 | 10/2014 |
| JP | 2017-014602 | 1/2017 |
| JP | 2018-206838 | 12/2018 |

\* cited by examiner

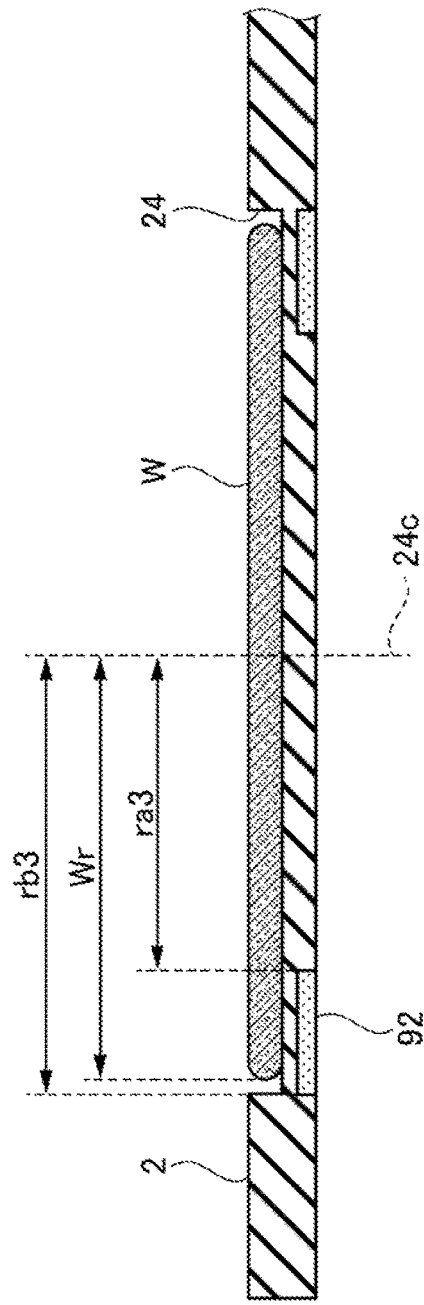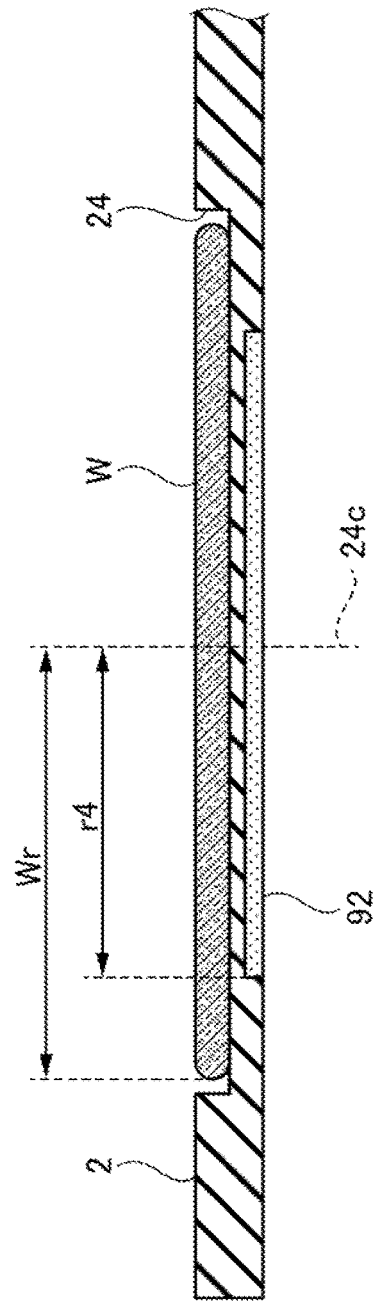

DEPOSITION APPARATUS

CROSS-REFERENCE TO RELATED APPLICATIONS

This patent application is based upon and claims priority to Japanese Patent Application No. 2020-016153 filed on Feb. 3, 2020, the entire contents of which are incorporated herein by reference.

TECHNICAL FIELD

The present disclosure relates to a deposition apparatus.

BACKGROUND

A device in which various films are deposited on wafers is known (see Patent Document 1, for example). In the device disclosed in Patent Document 1, multiple wafers are placed on a rotary table. By rotating the rotary table, the wafers revolve around the center of the rotary table, and repeatedly pass through a process gas supply region arranged along a radial direction of the rotary table. In this device, a heater is provided for heating wafers placed on the rotary table with in-plane temperature distribution of a concentric shape.

RELATED ART DOCUMENT

Patent Document

[Patent Document 1] Japanese Laid-open Patent Application Publication No. 2017-014602

SUMMARY

The present disclosure provides a technique for adjusting in-plane distribution of a substrate temperature.

A deposition apparatus according to one aspect of the present disclosure includes a vacuum vessel, a rotary table rotatably disposed in the vacuum vessel, a heating device provided below the rotary table, and a radiation adjusting member. The rotary table is configured such that multiple substrates can be placed on the rotary table along a circumferential direction of the rotary table. The heating device is configured to heat the multiple substrates by thermal radiation, and the radiation adjusting member is configured to adjust an amount of radiant heat from the heating device to the plurality of substrates.

BRIEF DESCRIPTION OF THE DRAWINGS

FIG. 10 is a cross-sectional view illustrating a third configuration example of the radiation adjusting member according to the first embodiment;

FIG. 11 is a cross-sectional view illustrating a fourth configuration example of the radiation adjusting member according to the first embodiment;

DETAILED DESCRIPTION OF EMBODIMENTS

Figure 1:
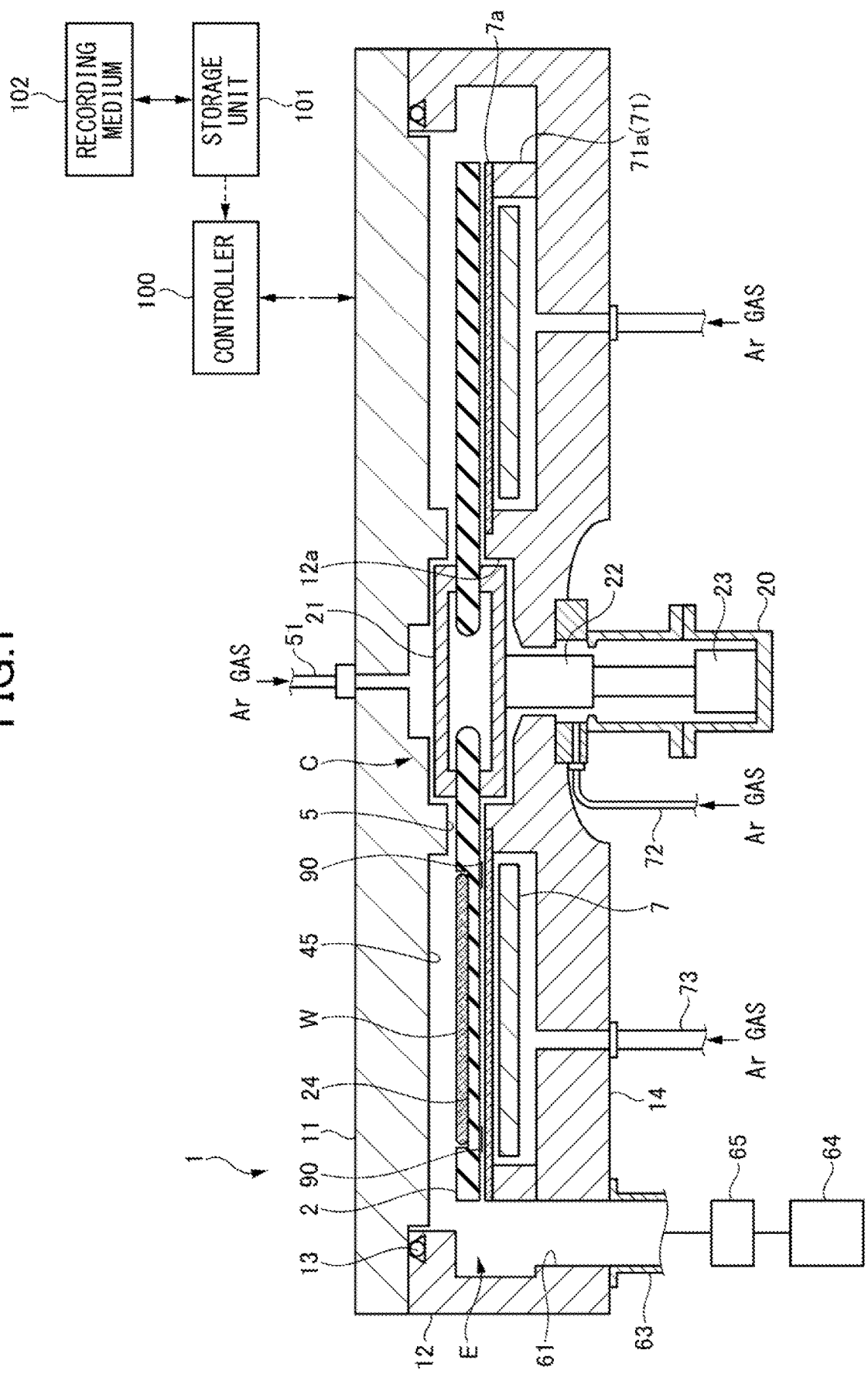
FIG. 1 is a cross-sectional view illustrating an example of the configuration of a deposition apparatus according to a first embodiment.

Hereinafter, non-limiting example embodiments of the present disclosure will be described with reference to the accompanying drawings. In all the accompanying drawings, the same or corresponding reference numerals are assigned to the same or corresponding parts or components, and duplicate descriptions will be omitted.

First Embodiment (Deposition Apparatus)

Figure 2:
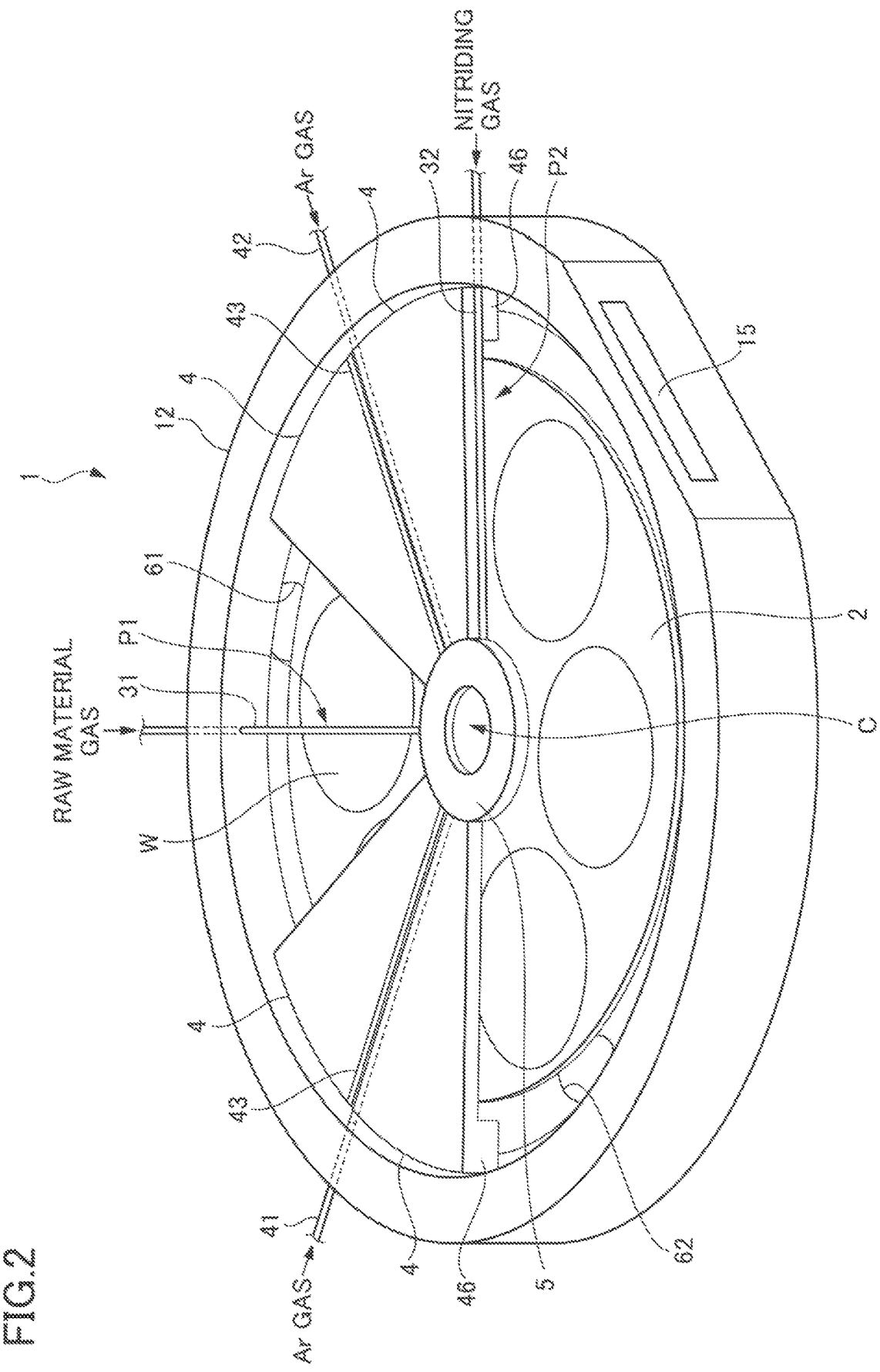
FIG. 2 is a perspective view illustrating the structure in a vacuum vessel of the deposition apparatus of FIG. 1.
Figure 3:
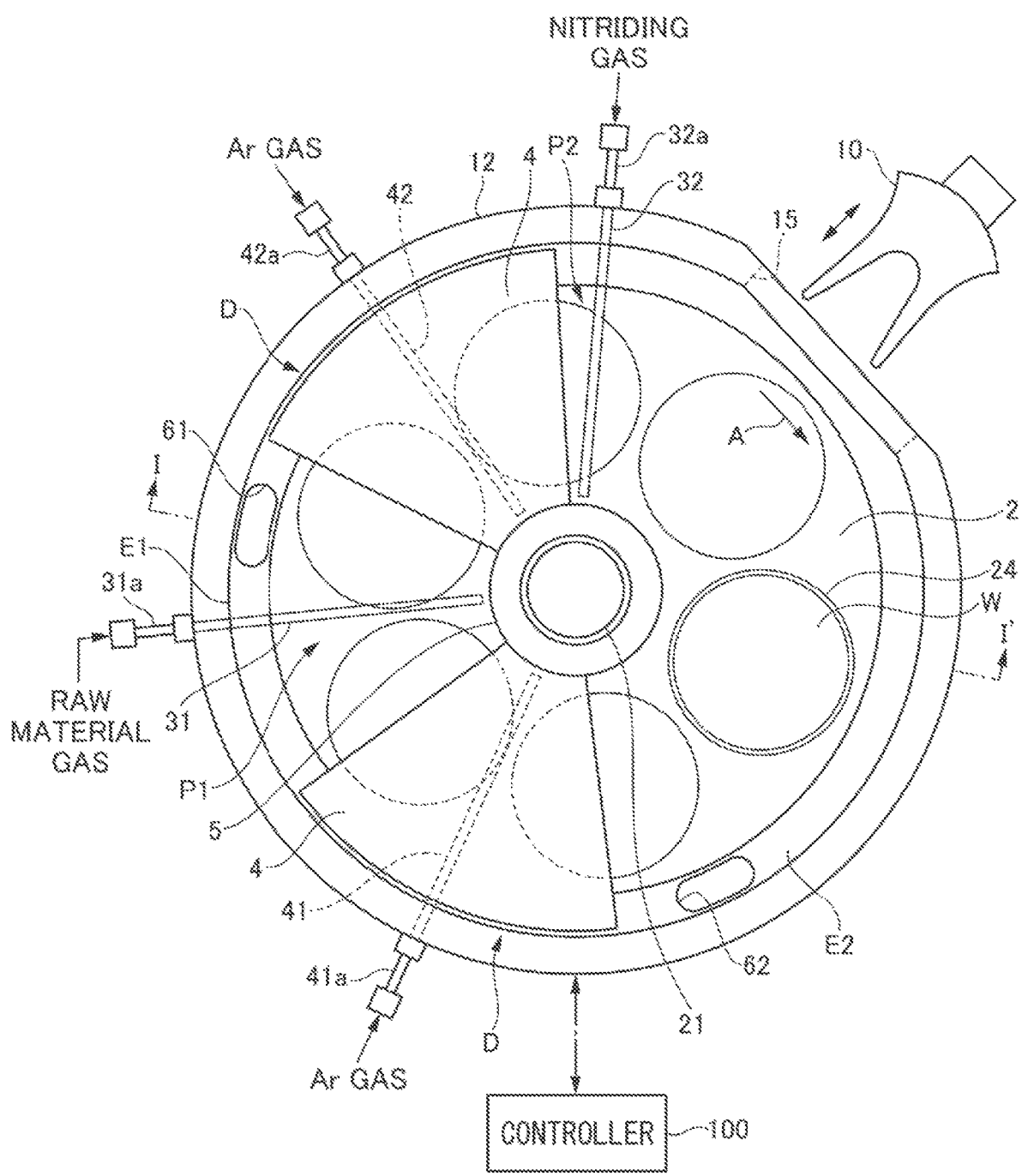
FIG. 3 is a plan view illustrating the configuration in the vacuum vessel of the deposition apparatus of FIG. 1.

A deposition apparatus according to a first embodiment will be described. FIG. 1 is a cross-sectional view illustrating an example of the configuration of a deposition apparatus according to the first embodiment. FIG. 2 is a perspective view illustrating the configuration in a vacuum vessel of the deposition apparatus of FIG. 1. FIG. 3 is a plan view illustrating the configuration in the vacuum vessel of the deposition apparatus of FIG. 1. In FIGS. 2 and 3, the top plate 11 is not illustrated.

Referring to FIGS. 1 to 3, a deposition apparatus includes a flat vacuum vessel 1 having a substantially circular planar shape, and a rotary table 2 disposed in the vacuum vessel 1. A center of rotation of the rotary table 2 is at the center of the vacuum vessel 1.

The vacuum vessel 1 includes a vessel body 12 having a cylindrical shape with a bottom, and a top plate 11 which is removably disposed on the upper surface of the vessel body 12 in an airtight manner via a sealing member 13 (FIG. 1), such as an O-ring.

The rotary table 2 is formed of a material that transmits radiation (thermal radiation) from a heater unit 7 to be described below, such as quartz. The center of the rotary table 2 is fixed to a cylindrical core 21. The core 21 is secured to the upper end of a vertically extending rotating shaft 22. The rotating shaft 22 penetrates the bottom 14 of the vacuum vessel 1, and the lower end of the rotating shaft 22 is attached to a drive section 23 that rotates the rotating shaft 22 (FIG. 1) about a vertical axis. The rotating shaft 22 and the drive section 23 are accommodated in a cylindrical casing having an open top surface. A flange portion is provided at the upper surface of the casing 20, and the flange portion is hermetically attached to the lower surface of the bottom 14 of the vacuum vessel 1. Thus, the internal atmosphere of the casing 20 is isolated from an external atmosphere.

A surface (upper surface) of the rotary table 2 is provided with circular recesses 24 on which multiple (six in the illustrated example) semiconductor wafers (hereinafter, referred to as "wafers W") that are substrates, are placed along a rotation direction (the circumferential direction) of the rotary table 2, as illustrated in FIGS. 2 and 3. For convenience, a wafer W is illustrated in FIG. 3 only in one of the recesses 24. Each of the recesses 24 has an inner diameter of, for example, 4 mm greater than the diameter of the wafer W, and has a depth approximately equal to the thickness of the wafer W. Therefore, when the wafer W is housed in the recess 24, the surface of the wafer W and the surface of the rotary table 2 (the area in which the wafer W is not placed) become the same height. Through-holes (not illustrated) are formed in the bottom surface of the recess 24 through which, for example, three lift pins penetrate to support the back surface of the wafer W and raise and lower the wafer W.

The back (lower) surface of the rotary table 2 is provided with a radiation adjusting member 90 for adjusting an amount of radiant heat (may also be referred to as "amount of radiation") to the multiple wafers W from the heater unit 7 to be described below, as illustrated in FIG. 1. The radiation adjusting member 90 will be described below.

As illustrated in FIGS. 2 and 3, above the rotary table 2, reactant gas nozzles 31 and 32 and the separation gas nozzles 41 and 42, which are made of quartz for example, are arranged in a circumferential direction of the vacuum vessel 1 (rotating direction of the rotary table 2 indicated by the arrow A illustrated in FIG. 3) spaced from each other. In the illustrated example, the separation gas nozzle 41, the reactant gas nozzle 31, the separation gas nozzle 42, and the reactant gas nozzle 32 are arranged clockwise (rotating direction of the rotary table 2) from the conveying port 15 in this order. The gas inlet ports 31a, 32a, 41a, and 42a (FIG. 3), which are proximal ends of the reactant gas nozzle 31, the reactant gas nozzle 32, the separation gas nozzle 41, and the separation gas nozzles 42 respectively, are secured to the outer peripheral wall of the vessel body 12. The reactant gas nozzles 31 and 32 and the separation gas nozzles 41 and 42 are introduced from the outer peripheral wall of the vacuum vessel 1 into the inside of the vacuum vessel 1, and are mounted so as to extend horizontally with respect to the rotary table 2, along the radial direction of the vessel body 12.

The reactant gas nozzle 31 is connected to a source (not illustrated) of a raw material gas via a pipe, a flow controller, and the like (not illustrated). For example, a gas containing silicon or a gas containing a metal may be used as a raw material gas.

The reactant gas nozzle 32 is connected to a source (not illustrated) of a nitriding gas via a pipe, a flow controller, and the like (not illustrated). For example, ammonia ($NH_3$) gas may be used as a nitriding gas.

The separation gas nozzles 41 and 42 are connected to a source (not illustrated) of a separation gas via a pipe, a flow control valve, and the like (not illustrated). For example, argon (Ar) gas or nitrogen ($N_2$) gas can be used as a separation gas.

In the reactant gas nozzles 31 and 32, multiple discharge holes 31h and 32h (FIG. 4) that open toward the rotary table 2 are arranged along the longitudinal direction of the reactant gas nozzles 31 and 32 respectively, at an interval of 10 mm, for example. A region below the reactant gas nozzle 31 is a raw material gas adsorption region P1 for causing the wafer W to adsorb a raw material gas. A region below the reactant gas nozzle 32 is a nitriding gas supply region P2 in which the raw material gas, having been adsorbed on the wafer W in the raw material gas adsorption region P1, is nitrided.

Referring to FIGS. 2 and 3, two projections 4 are provided in the vacuum vessel 1. As described below, the projections 4 are attached to the bottom surface of the top plate 11 such that the projections 4 protrude toward the rotary table 2, in order to configure separation regions D with the separation gas nozzles 41 and 42. Each of the projections 4 has a fan-shaped plane, the narrowest part of which is cut in an arc. In one embodiment, an inner arc of each of the projections 4 is connected to a protrusion 5 (described below), and an outer arc of each of the projections 4 is arranged along the inner peripheral surface of the vessel body 12 of the vacuum vessel 1.

Figure 4:
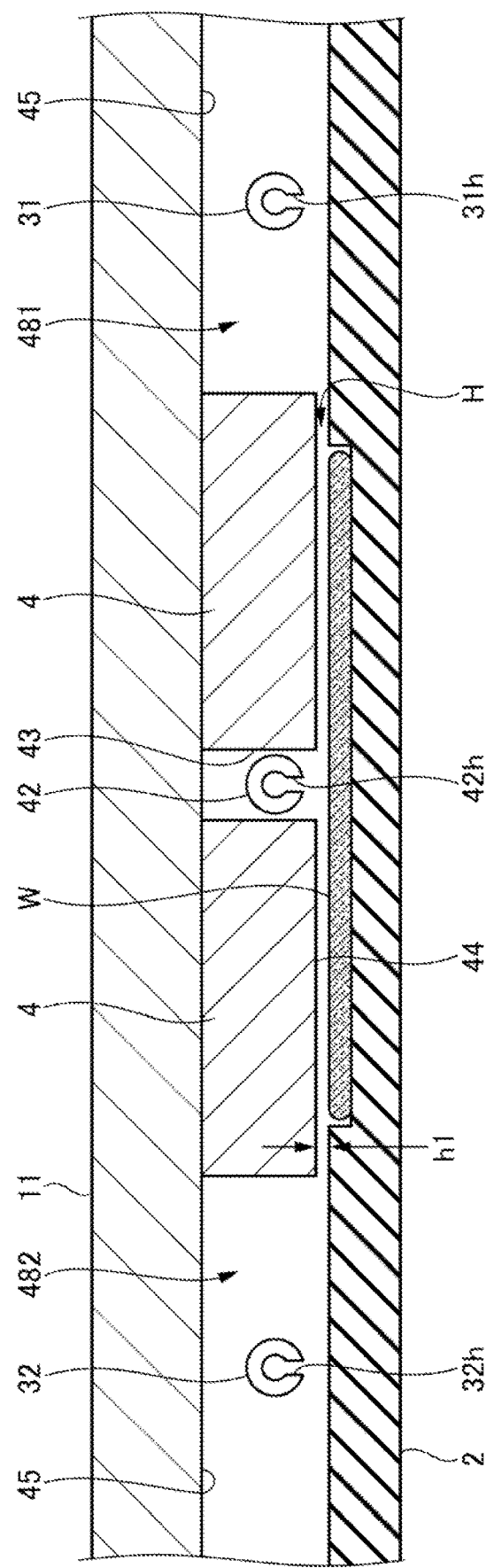
FIG. 4 is a cross-sectional view of the vacuum vessel taken along the concentric circle of a rotary table provided in the vacuum vessel of the deposition apparatus of FIG. 1.

FIG. 4 illustrates a cross-section of the vacuum vessel 1 taken along a concentric circle of the rotary table 2, from the reactant gas nozzle 31 to the reactant gas nozzle 32. As illustrated in FIG. 4, the projection 4 is attached to the back surface of the top plate 11. Therefore, within the vacuum vessel 1, a flat and low ceiling surface (first ceiling surface 44), which is a lower surface of the projection 4, and ceiling surfaces (second ceiling surfaces 45), which are higher than the first ceiling surface 44 and are located on both sides of the first ceiling surface 44 in the circumferential direction, are formed. The first ceiling surface 44 has a fan-like planar shape, the narrowest part of which is cut in an arc. Also, as illustrated, at the center of the projection 4 in the circumferential direction, a groove 43 that extends radially is formed, and the separation gas nozzle 42 is housed in the groove 43. Similarly, a groove 43 is formed in the other projection 4, and the separation gas nozzle 41 is housed in the groove 43. Also, the reactant gas nozzles 31 and 32 are also provided in the spaces below the respective second ceiling surfaces 45. These reactant gas nozzles 31 and 32 are located in the vicinity of the wafer W, which are spaced from the second ceiling surfaces 45. As illustrated in FIG. 4, the reactant gas nozzle 31 is provided in a space 481 below the second ceiling surface 45 at the right side of the projection 4, and the reactant gas nozzle 32 is provided in a space 482 below the second ceiling surface 45 at the left side of the projection 4.

Multiple discharge holes 42h (see FIG. 4) that open toward the rotary table 2 are arranged in the separation gas nozzle 42 accommodated in the groove 43 of the projection 4, along a longitudinal direction of the separation gas nozzle 42 at intervals of, for example, 10 mm. Similarly, multiple discharge holes 41h that open toward the rotary table 2 are arranged in the separation gas nozzle 41 accommodated in the groove 43 of the other projection 4, along a longitudinal direction of the separation gas nozzle 41 at intervals of, for example, 10 mm.

The first ceiling surface 44 forms a separation space H, which is a narrow space, above the rotary table 2. When Ar gas is supplied from the discharge hole 42h of the separation gas nozzle 42, the Ar gas flows through the separation space H toward the spaces 481 and 482. Because a volume of the separation space H is smaller than a volume of the spaces 481 and 482, when Ar gas flows, the pressure in the separation space H can be increased compared to the pressure in the spaces 481 and 482. That is, the high pressure separation space H is formed between the spaces 481 and 482. The Ar gas flowing from the separation space H into the spaces 481 and 482 acts as a counterflow against a raw material gas from the raw material gas adsorption region P1 and a nitriding gas from the nitriding gas supply region P2. Therefore, the raw material gas from the raw material gas adsorption region P1 and the nitriding gas from the nitriding gas supply region P2 are separated by the separation space H. Accordingly, occurrence of mixing and reaction of the raw material gas with the nitriding gas mix in the vacuum vessel 1 is suppressed.

The height h1 of the first ceiling surface 44 relative to the upper surface of the rotary table 2 is set to a height suitable for increasing the pressure in the separation space H compared to the pressure in the spaces 481 and 482, in consideration of the pressure in the vacuum vessel 1, the rotational speed of the rotary table 2, the flow rate of the separation gas (Ar gas), and the like during deposition.

Meanwhile, on the lower surface of the top plate 11, a protrusion 5 (FIGS. 2 and 3) is provided so as to surround the outer circumference of the core 21 that fixes the rotary table 2. In one embodiment, the protrusion 5 is continuous with a portion of the projection 4 on a side of the rotational center, and the lower surface of the protrusion 5 is formed at the same height as the first ceiling surface 44.

Figure 5:
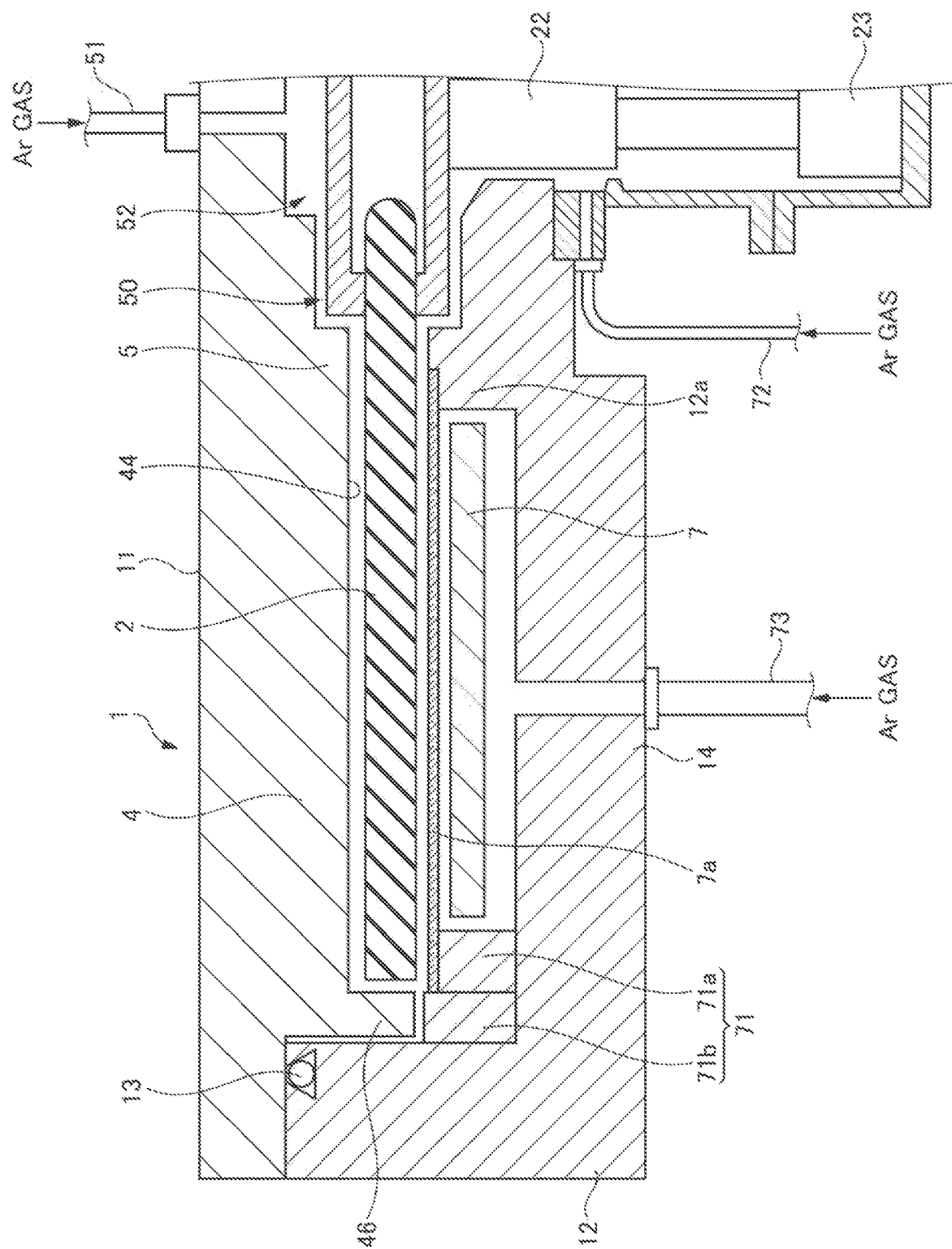
FIG. 5 is another cross-sectional view of the deposition apparatus of FIG. 1.

FIG. 1, which has been referred to above, is a cross-sectional view taken along the I-I' line in FIG. 3, and illustrates an area in which the second ceiling surface 45 is provided. In contrast, FIG. 5 is a cross-sectional view illustrating an area in which the first ceiling surface 44 is provided. As illustrated in FIG. 5, at the periphery of the fan-shaped projection 4 (the side closer to the outer periphery of the vacuum vessel 1), an L-shaped bent portion 46 is formed such that the bent portion 46 faces an outer edge of the rotary table 2. Similar to the projection 4, the bent portion 46 prevents a reactant gas from entering the separation region D from both sides, and thereby suppresses mixing of the raw material gas and the nitriding gas. As the fan-shaped projection 4 is provided on the top plate 11 and the top plate 11 can be removed from the vessel body 12, there is a slight gap between the outer peripheral surface of the bent portion 46 and the vessel body 12. A gap between the inner peripheral surface of the bent portion 46 and the outer end surface of the rotary table 2 and the gap between the outer peripheral surface of the bent portion 46 and the vessel body 12 are set to a dimension similar to, for example, the height of the first ceiling surface 44 relative to the upper surface of the rotary table 2.

In the separation region D, an inner circumferential wall of the vessel body 12 is formed to be straight in a vertical direction and is close to the outer circumferential surface of the bent portion 46 (FIG. 5). With respect to a portion other than the separation region D, as illustrated in FIG. 1, for example, the inner circumferential wall of the vessel body 12 is recessed outwardly from a location facing the outer edge of the rotary table 2 toward the bottom 14 (FIG. 1). Hereinafter, for the sake of explanation, the recessed portion having a generally rectangular cross-sectional shape is referred to as an exhaust region E. Specifically, the exhaust region communicating with the raw material gas adsorption region P1 is referred to as a first exhaust region E1, and the exhaust region communicating with the nitriding gas supply region P2 is referred to as a second exhaust region E2. At the bottoms of these first and second exhaust regions E1 and E2, a first exhaust port 61 and a second exhaust port 62 are formed, respectively, as illustrated in FIGS. 1 to 3. Each of the first exhaust port 61 and the second exhaust port 62 is connected, via an exhaust pipe 63, to a vacuum exhaust unit such as a vacuum pump 64. Also, a pressure controller 65 is provided at the exhaust pipe 63, and is configured to adjust the pressure within the vacuum vessel 1.

The heater unit 7 as a heating device is provided in the space between the rotary table 2 and the bottom 14 of the vacuum vessel 1, as illustrated in FIGS. 1 and 5. The heater unit 7 heats a wafer W on the rotary table 2 by thermal radiation to a temperature (e.g., 400 to 600° C.) determined in a process recipe. Below the rotary table 2, an annular cover member 71 is provided near the circumferential edge of the rotary table 2 (FIG. 5). The cover member 71 separates an atmosphere extending from a space above the rotary table 2 to the first exhaust region E1 and the second exhaust region E2, from an atmosphere in which the heater unit 7 is disposed, to prevent gas from entering an area below the rotary table 2. The cover member 71 includes an inner member 71a disposed at an area under the outer edge of the rotary table 2 and under a periphery of the outer edge of the rotary table 2, and includes an outer member 71b disposed between the inner member 71a and the inner side surface of the vacuum vessel 1. The outer member 71b is provided below the bent portion 46 formed at the outer edge of the projection 4 in the separation region D, and is in close proximity to the bent portion 46. The inner member 71a surrounds the heater unit 7 throughout its entire circumference, under the outer edge of the rotary table 2 (and slightly outside the outer edge).

A portion of the bottom 14 closer to the rotational center relative to the space accommodating the heater unit 7 extends upward toward a portion of the core 21 near the center of the bottom surface of the rotary table 2, to form an extending portion 12a. The space between the extending portion 12a and the core 21 is narrow, and the gap between the rotating shaft 22 passing through the bottom 14 and an inner peripheral surface of a through-hole for the rotating shaft 22 is also narrow. These narrow spaces communicate with the casing 20. The casing 20 is provided with a purge gas supply line 72 for supplying Ar gas serving as a purge gas to purge from the narrow spaces. Also, at the bottom 14 of the vacuum vessel 1, multiple purge gas supply lines 73 are provided at predetermined angular intervals below the heater unit 7, in order to purge from the space accommodating the heater unit 7 (one of the purge gas supply lines 73 is illustrated in FIG. 5). In addition, a lid member 7a is provided between the heater unit 7 and the rotary table 2 such that the lid member 7a circumferentially covers an area from the inner peripheral wall (the upper surface of the inner member 71a) of the outer member 71b to the upper end of the extending portion 12a, in order to prevent gas from entering the region accommodating the heater unit 7. The lid member 7a may be made of, for example, quartz.

A separation gas supply line 51 is connected to the center of the top plate 11 of the vacuum vessel 1, and is configured to supply Ar gas, which is a separation gas, to a space 52 between the top plate 11 and the core 21. The separation gas supplied to the space 52 is discharged along the surface of the rotary table 2, on which a wafer is placed, toward the periphery, through a narrow gap 50 between the protrusion 5 and the rotary table 2. The gap 50 may be maintained at a pressure higher than the spaces 481 and 482 by the separation gas. Therefore, the gap 50 prevents a raw material gas supplied to the raw material gas adsorption region P1 from mixing with a nitriding gas supplied to the nitriding gas supply region P2 through a central region C. That is, the gap 50 (or the central region C) functions in the same way as the separation space H (or the separation region D).

Further, as illustrated in FIGS. 2 and 3, the side wall of the vacuum vessel 1 is provided with a conveying port 15 for transferring a wafer W between an external transfer arm 10 and the rotary table 2. The conveying port 15 is opened and closed by a gate valve (not illustrated). Lift pins and a lifting mechanism (not illustrated) for lifting the wafer W from the back surface through the recesses 24 are provided below the rotary table 2 at a portion corresponding to the receiving position of the wafer W.

As illustrated in FIG. 1, the deposition apparatus includes a controller 100 configured by a computer, which controls overall operations of the deposition apparatus. A memory of the controller 100 stores a program that causes the deposition apparatus to perform a deposition method to be described below, under control of the controller 100. The program includes steps to perform the deposition method described below. The program is stored in a recording medium 102, such as a hard disk, a compact disc, a magneto-optical disc, a memory card, and a flexible disk. The program is loaded into a storage unit 101 by a predetermined reading device, and is installed in the controller 100.

(Radiation Adjusting Member)

The radiation adjusting member 90 adjusts an amount of radiation from the heater unit 7 to multiple wafers W. The radiation adjusting member 90 includes a radiation adjusting film 91 or a radiation adjusting layer 92. However, the radiation adjusting member 90 may include both the radiation adjusting film 91 and the radiation adjusting layer 92.

The radiation adjusting film 91 is provided on a portion of the lower surface of the rotary table 2. The radiation adjusting film 91 is provided to overlap, for example, with at least a portion of each of multiple wafers W in a plan view.

Figure 6:
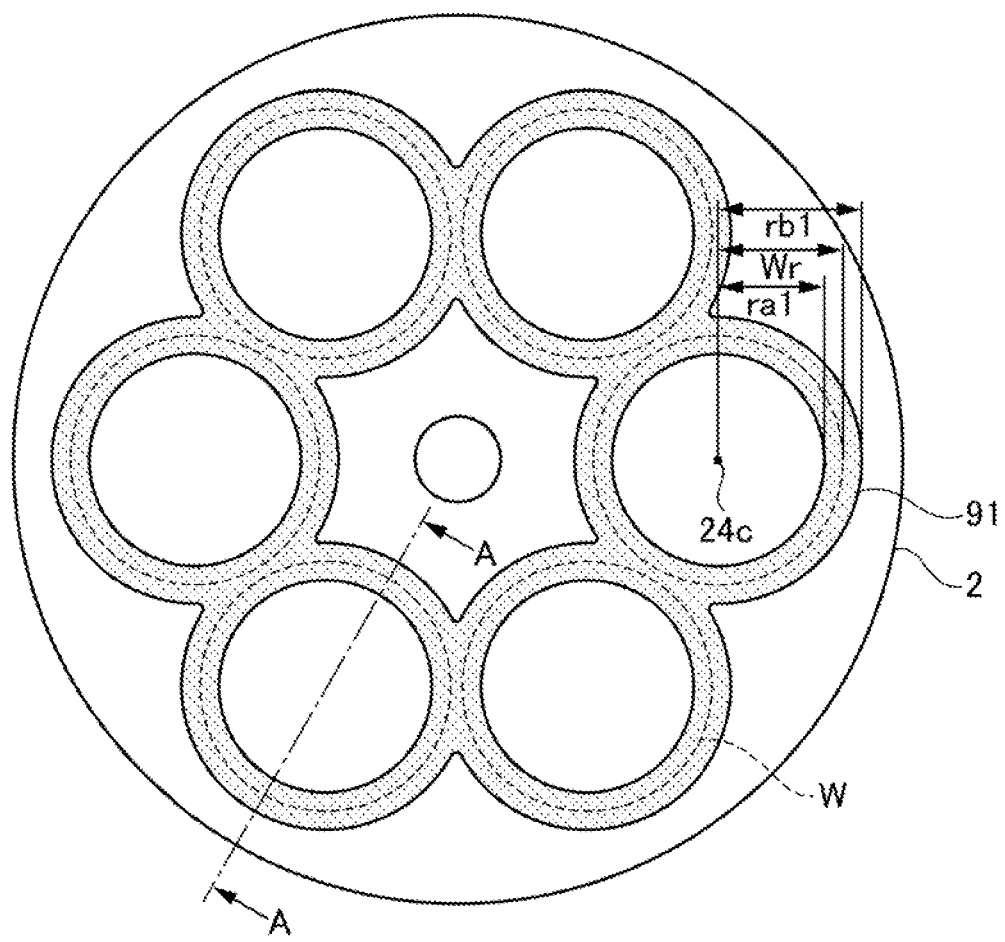
FIG. 6 is a plan view illustrating a first configuration example of a radiation adjusting member according to the first embodiment.
Figure 7:
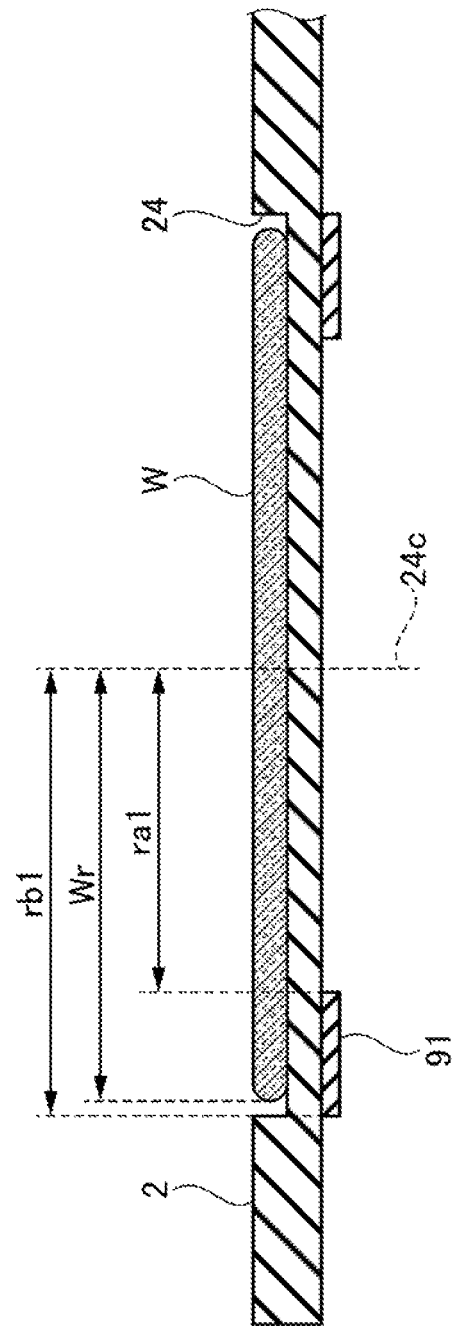
FIG. 7 is a cross-sectional view illustrating the first configuration example of the radiation adjusting member according to the first embodiment.

FIG. 6 is a plan view illustrating a first configuration example of the radiation adjusting member 90 according to the first embodiment, which is a view illustrating the rotary table 2 viewed from below. FIG. 7 is a cross-sectional view illustrating the first configuration example of the radiation adjusting member 90 according to the first embodiment, which illustrates a cross-section taken along the dashed dotted line A-A in FIG. 6. The radiation adjusting film 91 is provided to overlap with at least the outer periphery of each of the multiple wafers W in a planar view, as illustrated in FIGS. 6 and 7, for example. In other words, the radiation adjusting film 91 is formed into a shape of a ring with the center 24c of each of the recesses 24 as the center of the ring, an inner radius ra1 of which is smaller than the radius Wr of the wafer W and an outer radius rb1 of which is greater than the radius Wr of the wafer W.

Figure 8:
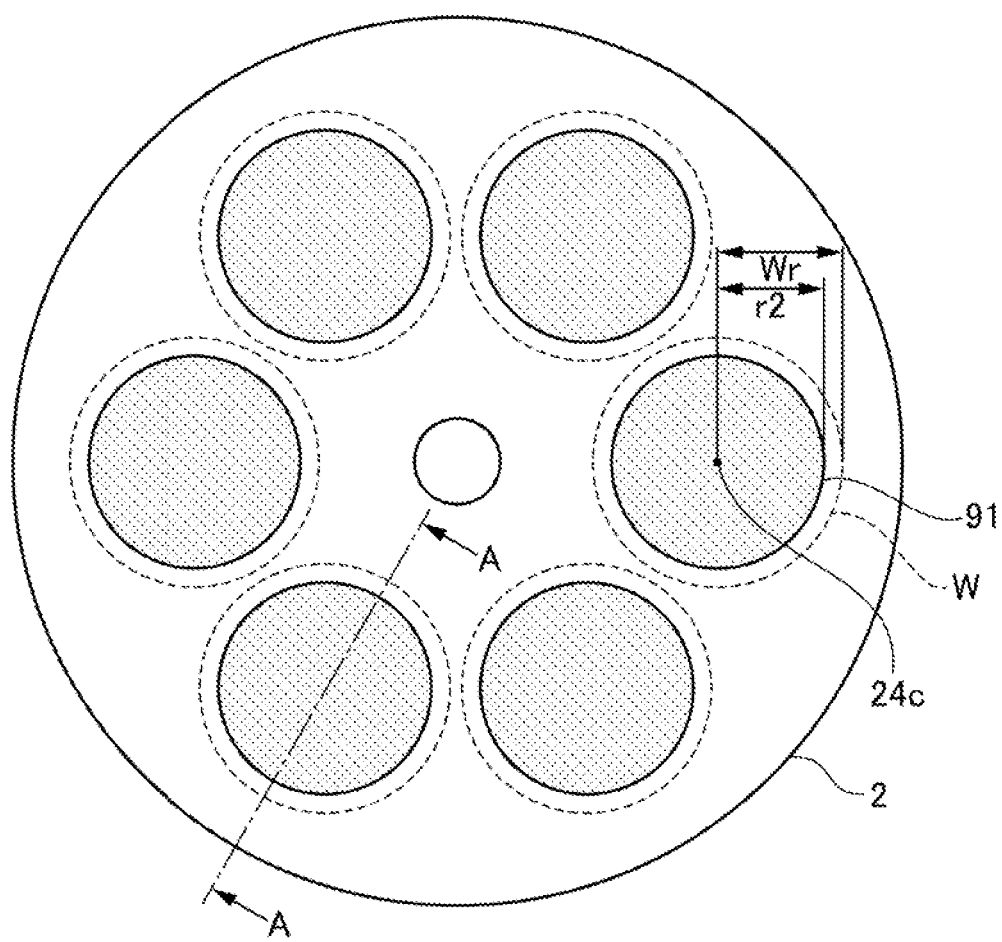
FIG. 8 is a plan view illustrating a second configuration example of the radiation adjusting member according to the first embodiment.
Figure 9:
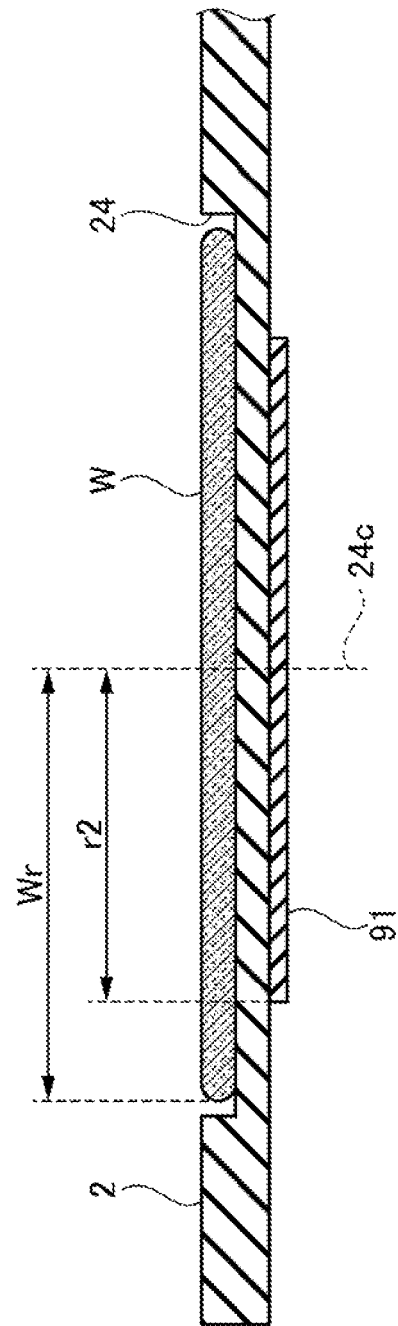
FIG. 9 is a cross-sectional view illustrating the second configuration example of the radiation adjusting member according to the first embodiment.

FIG. 8 is a plan view illustrating a second configuration example of the radiation adjusting member 90 according to the first embodiment, which is a view illustrating the rotary table 2 viewed from below; FIG. 9 is a cross-sectional view illustrating the second configuration example of the radiation adjusting member 90 according to the first embodiment, which illustrates a cross-section taken along the dashed dotted line A-A in FIG. 8. The radiation adjusting film 91 is provided to overlap with at least the center of each of the wafers W in a planar view, as illustrated, for example, in FIGS. 8 and 9. In other words, the radiation adjusting film 91 is formed in a circular shape whose center is located at the center 24c of each of the recesses 24, and a radius r2 of the radiation adjusting film 91 is smaller than the radius Wr of the wafer W.

As described above, the radiation adjusting film 91 is provided according to an area in which the amount of radiant heat from the heater unit 7 is to be adjusted.

The radiation adjusting film 91 includes, for example, a reflective film reflecting thermal radiation (radiant heat) from the heater unit 7 to multiple wafers W. Examples of the reflective film may include a silicon oxide film and a metal oxide film. Examples of a material of the metal oxide film include yttrium oxide ($Y_2O_3$) and aluminum oxide ($Al_2O_3$).

The radiation adjusting film 91 may include, for example, an absorption film that absorbs thermal radiation directed to multiple wafers W from the heater unit 7. Examples of the absorption film may include a silicon film, a silicon nitride film, and a metal nitride film.

The radiation adjusting layer 92 is formed in a portion of the lower surface of the rotary table 2. The radiation adjusting layer 92 is formed to overlap, for example, with at least a portion of each of the wafers W, in a plan view.

FIG. 10 is a cross-sectional view illustrating a third configuration example of the radiation adjusting member 90 according to the first embodiment. The radiation adjusting layer 92 is formed to overlap with at least the outer periphery of each of the multiple wafers W in a planar view, as illustrated in FIG. 10, for example. In other words, the radiation adjusting layer 92 is formed into a shape of a ring with the center 24c of each of the recesses 24 as the center of the ring, an inner radius ra3 of which is smaller than the radius Wr of the wafer W and an outer radius rb3 of which is greater than the radius Wr of the wafer W.

FIG. 11 is a cross-sectional view illustrating a fourth configuration example of the radiation adjusting member 90 according to the first embodiment. The radiation adjusting layer 92 is formed to overlap with at least the center of each of the multiple wafers W in a planar view, for example, as illustrated in FIG. 11. In other words, the radiation adjusting layer 92 is formed in a circular shape whose center is located at the center 24c of each of the recesses 24, and a radius r4 of the radiation adjusting layer 92 is smaller than the radius Wr of the wafer W.

As described above, the radiation adjusting layer 92 is formed according to an area in which the amount of radiation from the heater unit 7 is to be adjusted.

A surface of the radiation adjusting layer 92 has, for example, irregularities that reflect thermal radiation directed toward the multiple wafers W from the heater unit 7. The irregularities are formed, for example, by processing the lower surface of the rotary table 2 by abrasive blasting.

(Working Effect)

A working effect of the deposition apparatus including the radiation adjusting member 90 will be described. Hereinafter, it is assumed that the rotary table 2 is formed of a material that transmits radiant heat from the heater unit 7.

Figure 12:
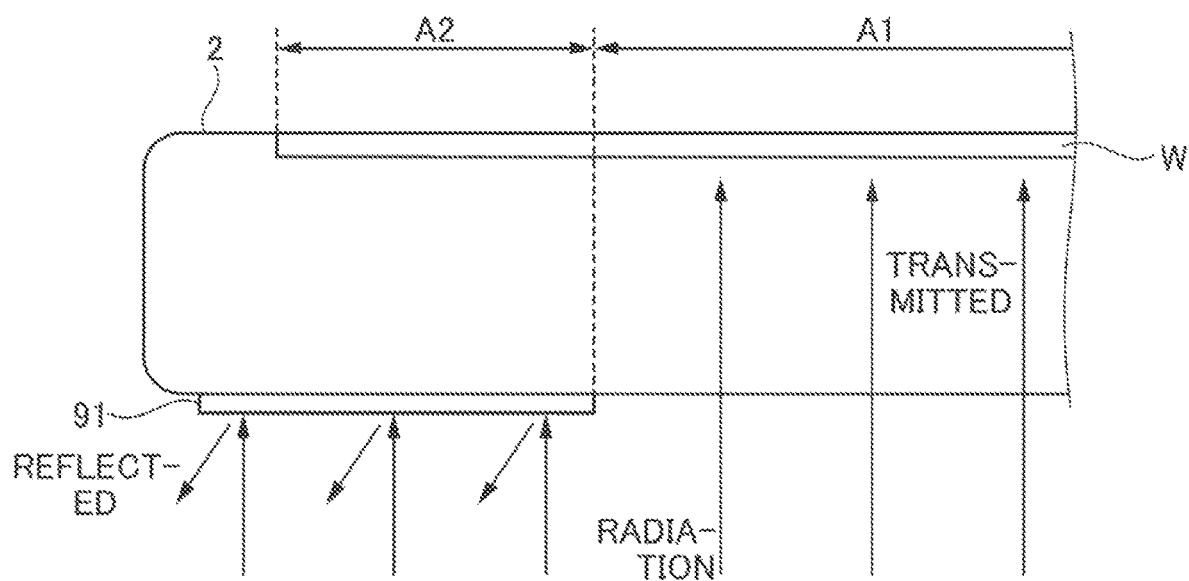
FIG. 12 is a diagram for explaining a mechanism for adjusting in-plane distribution of a wafer temperature.

First, a case in which the radiation adjusting member 90 includes a radiation adjusting film 91 overlapping with the outer peripheral portion of the wafer W in a plan view, and in which the radiation adjusting film 91 is a reflective film will be described. FIG. 12 is a diagram for explaining a mechanism for adjusting in-plane distribution of a wafer temperature, which is an enlarged view of the peripheral portion of the rotary table 2.

In the region A1 under which the radiation adjusting film 91 is not provided, thermal radiation from below the rotary table 2 is transmitted through the rotary table 2 and absorbed by the wafer W. Therefore, in the region A1, because the wafer W is easily heated, the temperature of the wafer W is easily increased. Meanwhile, in the region A2 under which the radiation adjusting film 91 is present, because the thermal radiation from below the rotary table 2 is reflected by the radiation adjusting film 91 at least in part, an amount of radiation absorbed by the wafer W is reduced. Therefore, in the region A2, because the wafer W is not easily heated as compared to the region A1, the temperature of the wafer W does not readily increase. As a result, the temperature of the central portion of the wafer W can be increased relative to the temperature of the outer peripheral portion of the wafer W. That is, the temperature difference between the center and the outer periphery of the wafer W can be adjusted.

Incidentally, in a case in which the radiation adjusting member 90 includes a radiation adjusting film 91 overlapping with the center of the wafer W in a plan view and the radiation adjusting film 91 is a reflective film, the temperature of the outer circumferential portion of the wafer W can be increased relative to the temperature of the central portion of the wafer W for similar reasons.

If the radiation adjusting film 91 is an absorption film, in the region A2 under which the radiation adjusting film 91 is present, at least part of thermal radiation from below the rotary table 2 is absorbed by the radiation adjusting film 91. At this time, by selecting, as the absorption film, a material whose absorption wavelength is different from the absorption wavelength of the wafer W, a portion of the thermal radiation can be absorbed without reducing thermal radiation reaching the wafer W. Accordingly, in the region A2 under which the radiation adjusting film 91 is present, the temperature of the rotary table 2 is increased by the heat absorbed, and the wafer W is heated by thermal radiation. As a result, the temperature of the region A2 under which the radiation adjusting film 91 is present can be increased to be higher than the temperature of the region A1 under which the radiation adjusting film 91 is not present. That is, the temperature difference between the center and the outer periphery of the wafer W can be adjusted.

As described above, by providing the radiation adjusting film 91 or the radiation adjusting layer 92 as the radiation adjusting member 90 so as to overlap with at least a portion of the wafer W in a plan view, in-plane distribution of the temperature of the wafer W can be adjusted.

(Deposition Method)

A deposition method according to an embodiment will be described with reference to an example in which a silicon nitride film is formed using the above-described deposition apparatus.

First, the gate valve (not illustrated) is opened, and wafers W are supplied to the recesses 24 of the rotary table 2 from the outside, with the transfer arm 10 through the conveying port 15. A wafer W is passed to a recess 24 in the rotary table 2 by raising and lowering the lift pins (not illustrated) from the bottom side of the vacuum vessel 1 through the through-holes in the bottom surface of the recess 24 when the recess 24 stops at a position facing the conveying port 15. By repeating the above-described passing operations while intermittently rotating the rotary table 2, the wafers W are placed into the respective six recesses 24 in the rotary table 2.

Subsequently, the gate valve is closed, and the vacuum vessel 1 is evacuated to an attainable vacuum level by the vacuum pump 64. Thereafter, Ar gas is discharged as the separation gas, from the separation gas nozzles 41 and 42 at a predetermined flow rate, and Ar gas is discharged from the separation gas supply line 51 and the purge gas supply line 72 at a predetermined flow rate. In addition, the inside of the vacuum vessel 1 is controlled to a preset processing pressure by the pressure controller 65. The wafer W is then heated to, for example, 400 to 600° C. by the heater unit 7 while the rotary table 2 is rotated clockwise.

Then, a raw silicon gas, which is an example of a raw material gas, is supplied from the reactant gas nozzle 31, and $NH_3$ gas, which is an example of a nitriding gas, is supplied from the reactant gas nozzle 32.

By rotating the rotary table 2, the wafers W repeatedly pass through the raw material gas absorption region P1, the separation region D, the nitriding gas supply region P2, and the separation region D in this order. In the raw material gas adsorption region P1, $SiH_3$ groups are generated on the surfaces of the wafers W, and in the nitriding gas supply region P2, the $SiH_3$ groups generated on the surfaces of the wafers W are nitrided by $NH_3$ gas molecules. By repeating the above-described process, a silicon nitride film having a desired film thickness is deposited.

At this time, because the radiation adjusting member 90 is provided on the lower surface of the rotary table 2, in-plane distribution of the temperature of the wafers W can be adjusted.

(Evaluation Result)

Next, in the deposition apparatus in which the radiation adjusting film 91 is provided in an area overlapping with the outer periphery of a wafer W in a plan view, on the lower surface of the rotary table 2, a wafer W was placed on the rotary table 2, and the temperature of the wafer W when the wafer W was heated by the heater unit 7 was measured. As the radiation adjusting film 91, a reflective film (film thickness: 200 µm) formed by thermal spraying yttrium oxide was used. Also, for comparison, in a deposition apparatus not having the radiation adjusting member 90, a wafer W was placed on the rotary table 2, and the temperature of the wafer W when the wafer W was heated by the heater unit 7 was measured.

Figure 13A:
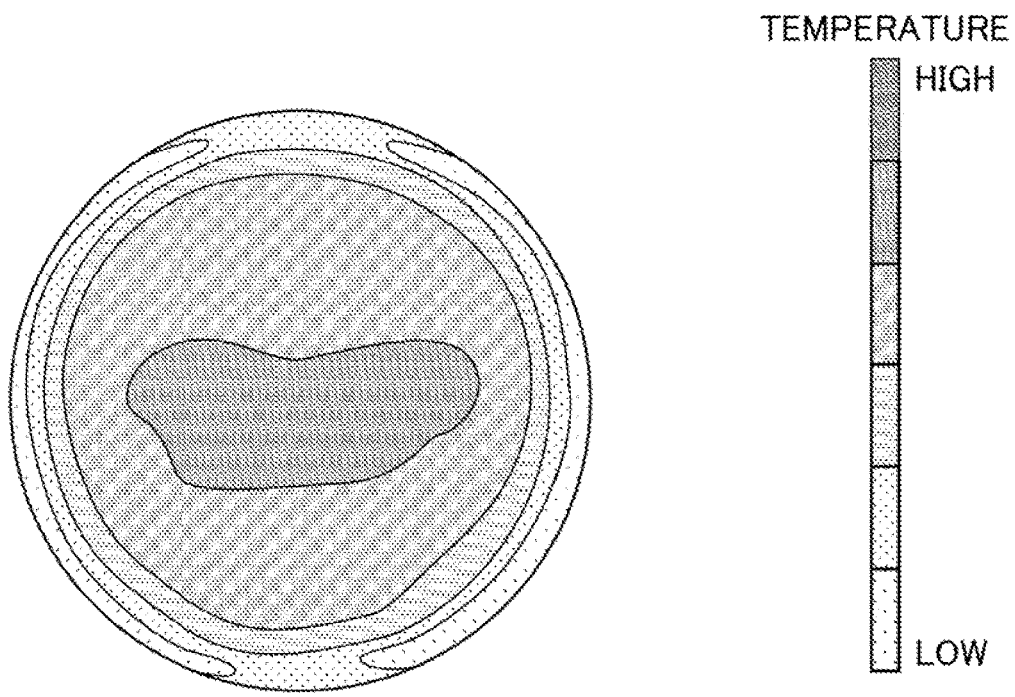
FIGS. 13A and 13B are diagrams illustrating results of measuring in-plane distribution of a wafer temperature.
Figure 13B:
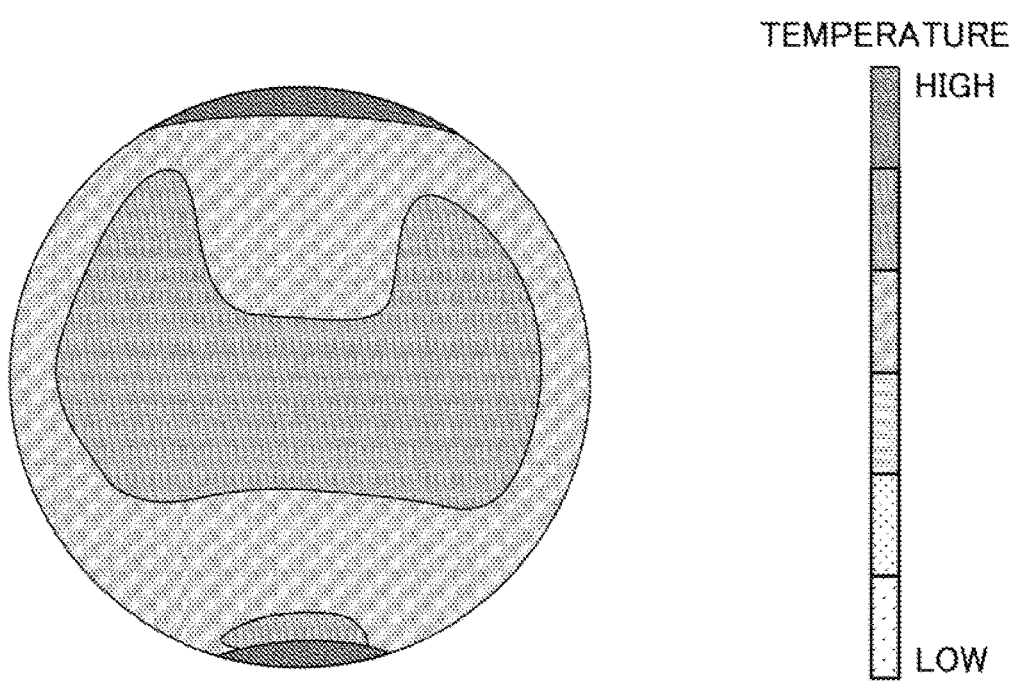

FIGS. 13A and 13B are diagrams illustrating results of measuring in-plane distribution of a wafer temperature. FIG. 13A illustrates a result when the deposition apparatus in which the radiation adjusting film 91 is provided in an area overlapping with the outer periphery of the wafer W was used, and FIG. 13B illustrates a result when the deposition apparatus not having the radiation adjusting member 90 was used.

As illustrated in FIG. 13A, in a case in which the deposition apparatus in which the radiation adjusting film 91 is provided in an area overlapping with the outer periphery of the wafer W was used, it was confirmed that a temperature of the outer periphery of the wafer W corresponding to the area in which the radiation adjusting film 91 was provided was lower than the temperature of the central portion of the wafer W.

In contrast, as illustrated in FIG. 13B, in a case in which the deposition apparatus not having the radiation adjusting member 90 was used, it was confirmed that the temperature of the outer periphery of the wafer W was higher than the temperature of the central portion of the wafer W.

From the above-described results, it can be said that, by providing the radiation adjusting film 91 which is a reflective film, the temperature of a portion of the wafer W corresponding to an area in which the radiation adjusting film 91 is provided can be lowered. That is, in-plane distribution of the temperature of the wafer W can be adjusted.

Second Embodiment

Figure 14:
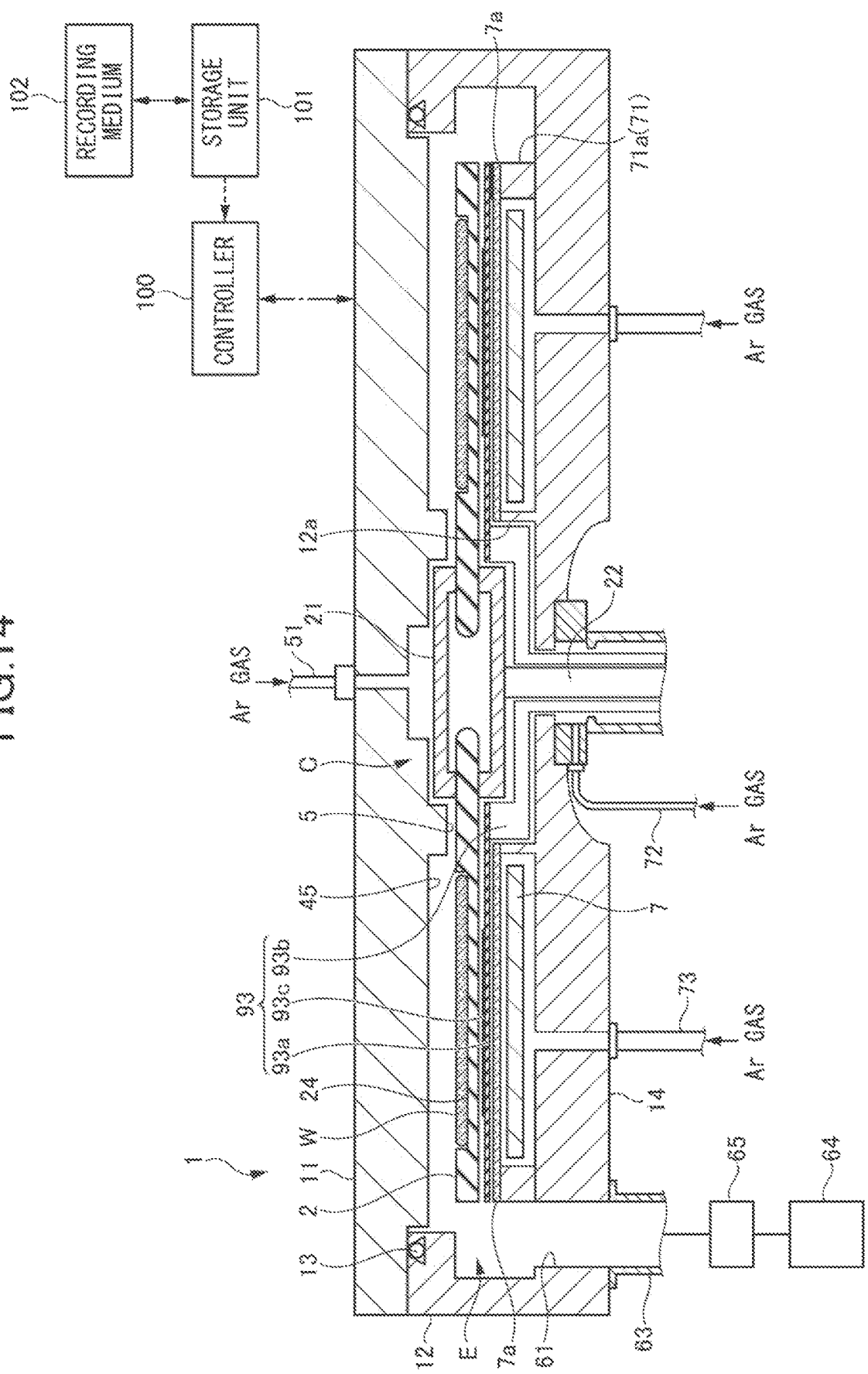
FIG. 14 is a cross-sectional view illustrating an example of the configuration of a deposition apparatus according to a second embodiment.
Figure 15:
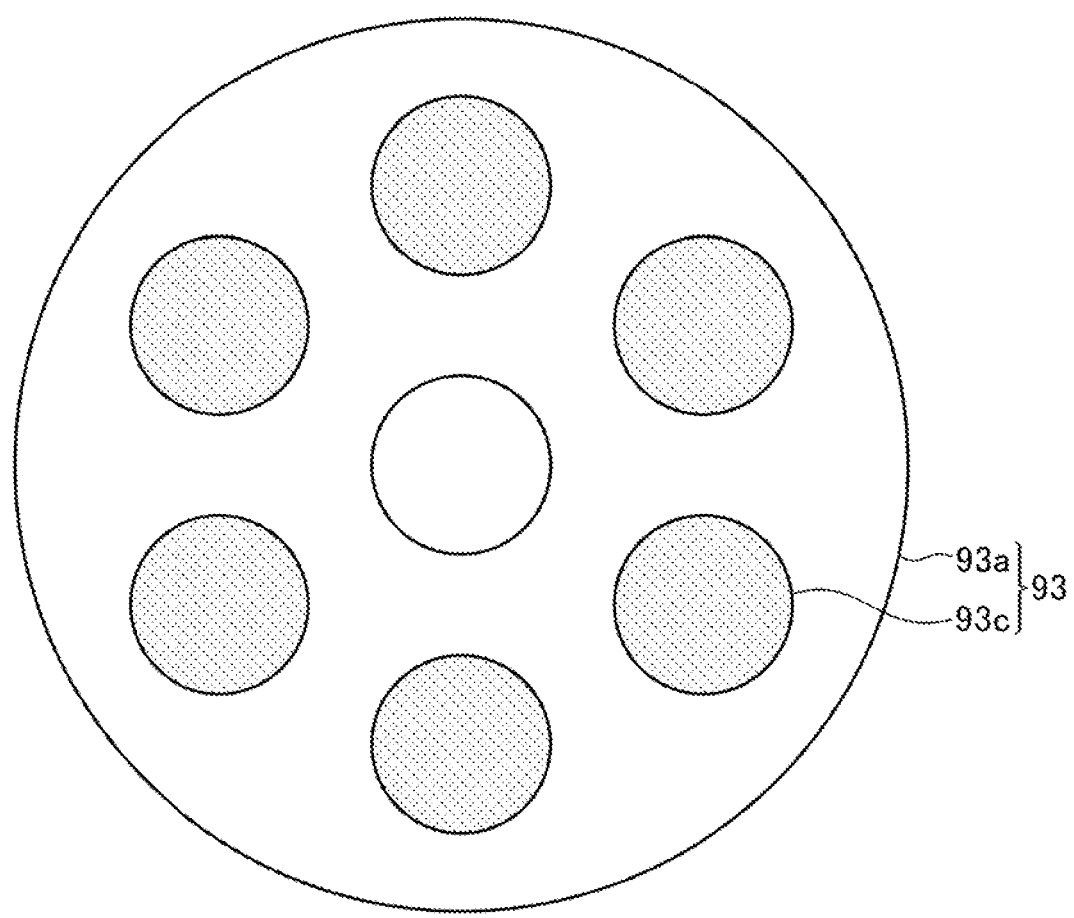
FIG. 15 is a plan view illustrating an example of a radiation adjusting member according to the second embodiment.

A deposition apparatus according to a second embodiment will be described. FIG. 14 is a cross-sectional view illustrating an example of the configuration of a deposition apparatus according to the second embodiment. The deposition apparatus according to the second embodiment includes a radiation adjusting member 93 (FIG. 15) provided between the rotary table 2 and the heater unit 7, instead of the radiation adjusting member 90 in the deposition apparatus according to the first embodiment. As the other points are the same as those of the deposition apparatus according to the first embodiment, the points that differ from the deposition apparatus according to the first embodiment will be mainly described below.

The radiation adjusting member 93 includes a rotary plate 93a, a rotating shaft 93b, and a radiation adjusting film 93c.

The shape of the rotary plate 93a is annular. The rotary plate 93a is formed of a material, such as quartz, that transmits thermal radiation from the heater unit 7. The central portion of the rotary plate 93a is fixed to the rotating shaft 93b.

The rotating shaft 93b has a generally cylindrical shape. The rotating shaft 93b penetrates the bottom 14 of the vacuum vessel 1, and the lower end of the rotating shaft 93b is attached to a drive section (not illustrated) that rotates the rotating shaft 93b about a vertical axis. Accordingly, the rotating shaft 93b revolves independently of the rotating shaft 22 that rotates the rotary table 2, and rotates the rotary plate 93a independently of the rotary table 2. The rotating shaft 93b and the drive section are accommodated in the casing 20.

The radiation adjusting film 93c is provided on the upper surface of the rotary plate 93a. However, the radiation adjusting film 93c may be provided on the lower surface of the rotary plate 93a. The radiation adjusting film 93c is provided to overlap with at least a portion of each of the multiple wafers W in a planar view. For example, as illustrated in FIG. 14, the radiation adjusting film 93c is provided so as to overlap with at least the central portion of each of the multiple wafers W in a planar view. Alternatively, the radiation adjusting film 93c may be provided to overlap, for example, with at least the outer periphery of each of the multiple wafers W in a planar view. As described above, the radiation adjusting film 93c is provided according to an area in which the amount of radiant heat from the heater unit 7 is to be adjusted. The radiation adjusting film 93c includes, for example, a reflective film reflecting radiant heat directed toward multiple wafers W from the heater unit 7. The reflective film may be the same as the reflective film in the first embodiment.

Figure 16A:
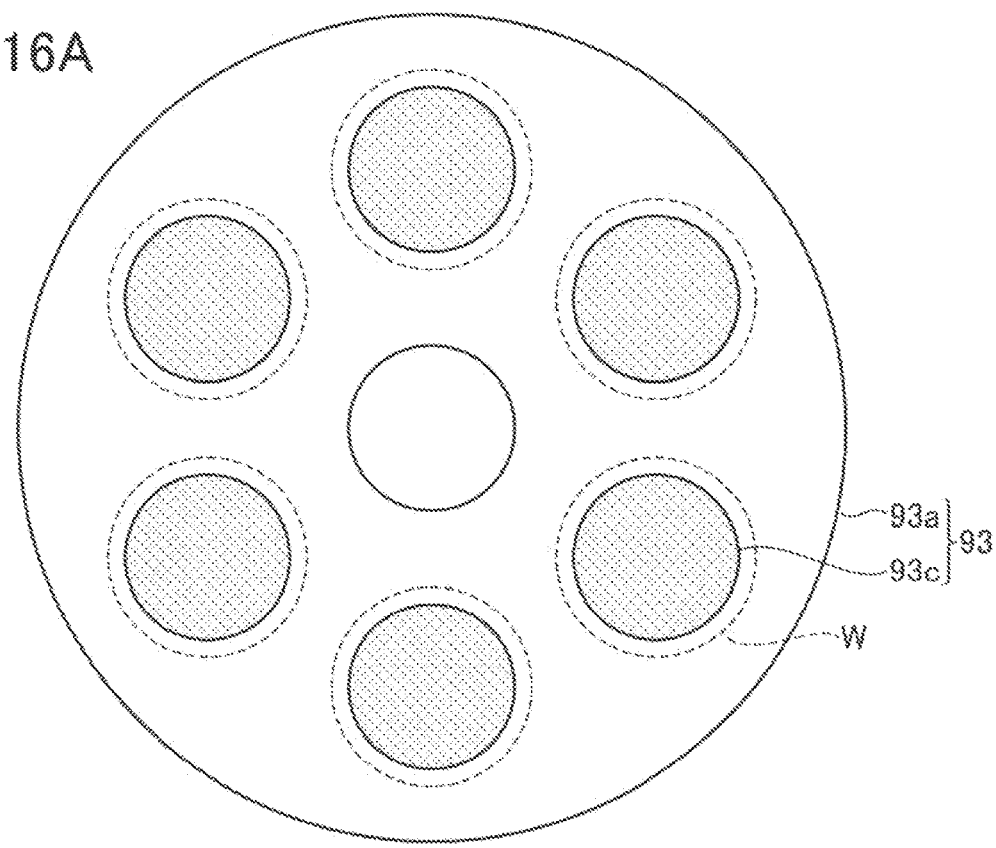
FIGS. 16A and 16B are plan views each illustrating an example of an operation of the radiation adjusting member of FIG. 15.
Figure 16B:
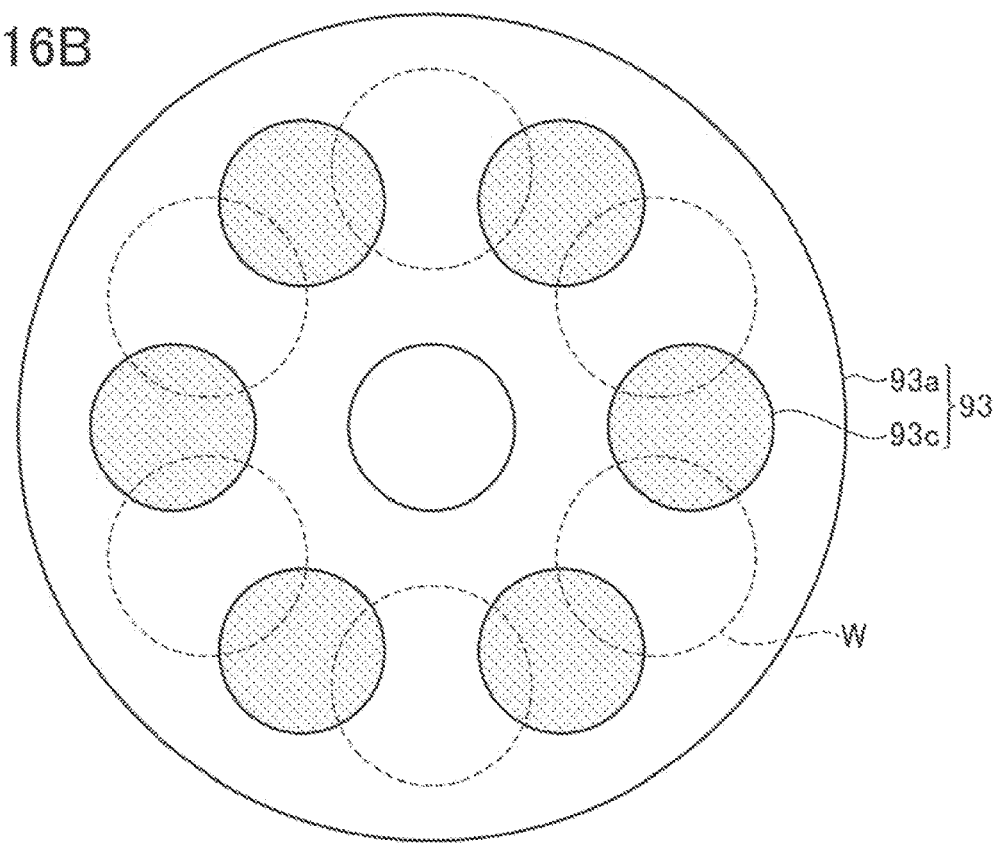

Next, an example of an operation of the radiation adjusting member 93 will be described. FIGS. 16A and 16B are plan views each illustrating an example of the operation of the radiation adjusting member 93 of FIG. 15.

First, the gate valve (not illustrated) is opened, and the wafers W are supplied to the recesses 24 of the rotary table 2 from the outside, with the transfer arm 10 through the conveying port 15. A wafer W is passed to a recess 24 in the rotary table 2 by raising and lowering the lift pins (not illustrated) from the bottom side of the vacuum vessel 1 through the through-holes in the bottom surface of the recess 24 when the recess 24 stops at a position facing the conveying port 15. By repeating the above-described passing operations while intermittently rotating the rotary table 2, the wafers W are placed in the respective six recesses 24 in the rotary table 2.

Subsequently, the gate valve is closed, and the vacuum vessel 1 is evacuated to an attainable vacuum level by the vacuum pump 64. Thereafter, Ar gas as the separation gas is discharged from the separation gas nozzles 41 and 42 at a predetermined flow rate, and Ar gas is discharged from the separation gas supply line 51 and the purge gas supply line 72 at a predetermined flow rate. In addition, the inside of the vacuum vessel 1 is controlled to a preset processing pressure by the pressure controller 65. The wafer W is then heated to, for example, 400 to 600° C. by the heater unit 7 while the rotary table 2 is rotated clockwise.

Then, a raw silicon gas, which is an example of a raw material gas, is supplied from the reactant gas nozzle 31, and $NH_3$ gas, which is an example of a nitriding gas, is supplied from the reactant gas nozzle 32.

By rotating the rotary table 2, the wafers W repeatedly pass through the raw material gas absorption region P1, the separation region D, the nitriding gas supply region P2, and the separation region D in this order. Thus, in the raw material gas adsorption region P1, $SiH_3$ groups are generated on the surfaces of the wafers W, and, in the nitriding gas supply region P2, the $SiH_3$ groups generated on the surface of the wafer W are nitrided by $NH_3$ gas molecules.

At this time, the controller 100 operates the rotary table 2 and the rotary plate 93a in a first rotation mode and/or a second rotation mode. The controller 100 also controls a period to operate the rotary table 2 and the rotary plate 93a in the first rotation mode and a period to operate the rotary plate 93a in the second rotation mode.

The first rotation mode is a mode in which the rotary plate 93a is rotated at a rate in synchronization with rotational speed of the rotary table 2, while the center of each of the wafers W coincides with the center of a corresponding radiation adjusting film 93c, as illustrated in FIG. 16A. In the first rotation mode, the temperature of the outer periphery of the wafer W can be raised relative to the temperature of the central portion of the wafer W.

The second rotation mode is a mode in which the rotary table 2 and the rotary plate 93a are rotated without synchronizing rotational speed of the rotary plate 93a with that of the rotary table 2, as illustrated in FIG. 16B. In the second rotation mode, the temperature difference between the outer periphery and the central portion of the wafer W is unlikely to occur.

As described above, when depositing a silicon nitride film, the rotary table 2 and the rotary plate 93a are operated in the first rotation mode and/or the second rotation mode, and a period for operating the rotary table 2 and the rotary plate 93a in the first rotation mode and a period for operating the rotary table 2 and the rotary plate 93a in the second rotation mode are controlled. Thus, the temperature difference that occurs between the outer periphery and the central portion of the wafer W can be adjusted. Therefore, the thickness of the silicon nitride film formed on the wafer W can be adjusted.

The second embodiment describes a case in which the radiation adjusting film 93c includes a reflective film reflecting radiant heat directed toward multiple wafers W from the heater unit 7, but the present disclosure is not limited thereto. For example, the radiation adjusting film 93c may include an absorption film that absorbs radiant heat directed toward multiple wafers W from the heater unit 7. The absorption film may be, for example, the same absorption film as in the first embodiment. Further, instead of the radiation adjusting film 93c, a radiation adjusting layer having irregularities that reflect radiant heat directed toward multiple wafers W from the heater unit 7 may be provided. The irregularities may be formed, for example, by processing the lower surface of the rotary plate 93a by abrasive blasting.

Although the first embodiment and the second embodiment have been described, the first embodiment and the second embodiment may be combined. That is, the deposition apparatus may include both the radiation adjusting member 90 and the radiation adjusting member 93.

The embodiments disclosed herein should be considered to be exemplary in all respects and not restrictive. The above embodiments may be omitted, substituted, or modified in various forms without departing from the appended claims and spirit thereof.

Incidentally, although the above-described embodiments have described a case in which the deposition apparatus is a device for depositing a silicon nitride film, the present disclosure is not limited thereto. For example, the deposition apparatus may be a device for depositing a silicon oxide film or a high-k film.

The above-described embodiments have described a case in which the deposition apparatus includes the reactant gas nozzles 31 and 32 and the separation gas nozzles 41 and 42, but the present disclosure is not limited thereto. For example, the deposition apparatus may further include a gas nozzle for supplying a refining gas into the vacuum vessel 1. For example, the deposition apparatus may include a plasma generator that forms the refining gas into a plasma.

What is claimed is:

1. A deposition apparatus comprising:
   a vacuum vessel;
   a rotary table on which a plurality of substrates are placed in a circumferential direction of the rotary table, the rotary table being disposed in the vacuum vessel so as to be rotatable;
   a heating device provided below the rotary table, the heating device being configured to heat the plurality of substrates by thermal radiation;
   a radiation adjusting member configured to adjust an amount of radiant heat from the heating device to the plurality of substrates; and
   a controller,
   wherein the radiation adjusting member includes
      a rotary plate,
      a rotating shaft configured to cause rotation of the rotary plate independently of the rotary table, and
      films provided on the rotary plate, the films being configured to adjust respective amounts of the radiant heat to the plurality of substrates,
   wherein the controller is configured to:
      rotate the rotary table and the rotary plate in different modes, the different modes including
         a first rotational mode by which the rotary table and the rotary plate are respectively rotated at a first rotational speed and a second rotational speed such that,
            the first rotational speed is matched to the second rotational speed, and
            centers of the plurality of substrates are respectively aligned with centers of the films, and
         a second rotational mode by which the rotary table and the rotary plate are respectively rotated at a third rotational speed and a fourth rotational speed such that the third rotational speed is not matched to the fourth rotational speed, and
      control (i) a first amount of time rotating the rotary table and the rotary plate in the first rotational mode and (ii) a second amount of time rotating the rotary table and the rotary plate in the second rotational mode, to adjust a temperature difference between an outer periphery and a central portion of each substrate.

2. The deposition apparatus according to claim 1, wherein the rotary table is formed of a material transmitting the radiant heat.

3. The deposition apparatus according to claim 2, wherein the material transmitting the radiant heat is quartz.

4. The deposition apparatus according to claim 1, wherein the films are provided on a portion of a lower surface of the rotary table.

5. The deposition apparatus according to claim 4, wherein each of the films includes a reflective film configured to reflect the radiant heat.

6. The deposition apparatus according to claim 5, wherein the reflective film is a silicon oxide film or a metal oxide film.

7. The deposition apparatus according to claim 4, wherein each of the films includes an absorption film configured to absorb the radiant heat.

8. The deposition apparatus according to claim 7, wherein the absorption film is a silicon film, a silicon nitride film, or a metal nitride film.

9. The deposition apparatus according to claim 1, wherein a surface of each of the films has irregularities.

10. The deposition apparatus according to claim 9, wherein the irregularities are formed by abrasive blasting.

11. The deposition apparatus according to claim 1, wherein the films are provided so as to overlap with at least a portion of each of the plurality of substrates, in a plan view.

12. The deposition apparatus according to claim 11, wherein the films are provided so as to overlap with at least a peripheral portion of each of the plurality of substrates, in the plan view.

13. The deposition apparatus according to claim 11, wherein the films are provided so as to overlap with at least a center of each of the plurality of substrates, in the plan view.

* * * * *